(12) United States Patent
Ishiguro

(10) Patent No.: US 8,012,888 B2
(45) Date of Patent: Sep. 6, 2011

(54) SUBSTRATE PROCESSING APPARATUS AND SEMICONDUCTOR DEVICE MANUFACTURING METHOD

(75) Inventor: Kenichi Ishiguro, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 197 days.

(21) Appl. No.: 12/223,866

(22) PCT Filed: Feb. 16, 2007

(86) PCT No.: PCT/JP2007/052824
§ 371 (c)(1),
(2), (4) Date: Oct. 3, 2008

(87) PCT Pub. No.: WO2007/099786
PCT Pub. Date: Sep. 7, 2007

(65) Prior Publication Data
US 2009/0203229 A1 Aug. 13, 2009

(30) Foreign Application Priority Data
Feb. 23, 2006 (JP) .................................. 2006-046855

(51) Int. Cl.
*H01L 21/477* (2006.01)

(52) U.S. Cl. ................. 438/795; 257/E21.211; 257/684; 257/697; 257/E23.011; 118/500; 118/620

(58) Field of Classification Search .................. 438/795, 438/478; 257/E21.211, 697, 684, E23.011, 257/E23.174, E23.067, E23.169; 118/500, 118/728, 620, 723; 414/160, 287, 332, 403
See application file for complete search history.

(56) References Cited

U.S. PATENT DOCUMENTS

| | | | | |
|---|---|---|---|---|
| 4,985,722 A | * | 1/1991 | Ushijima et al. | 396/624 |
| 5,552,124 A | * | 9/1996 | Su | 156/345.1 |
| 5,820,686 A | * | 10/1998 | Moore | 118/730 |
| 5,867,359 A | * | 2/1999 | Sherman | 361/234 |
| 6,099,302 A | * | 8/2000 | Hong et al. | 432/259 |
| 6,112,042 A | * | 8/2000 | Imamura et al. | 399/277 |

(Continued)

FOREIGN PATENT DOCUMENTS

JP   A-05-041358   2/1993

(Continued)

OTHER PUBLICATIONS

Taiwanese Office Action issued in Application No. 096106040; Dated Apr. 29, 2010 (With Translation).

*Primary Examiner* — N Drew Richards
*Assistant Examiner* — Ankush k Singal
(74) *Attorney, Agent, or Firm* — Oliff & Berridge PLC

(57) ABSTRACT

Provided is a substrate processing apparatus comprising: a process chamber for processing a substrate; a heater for heating an interior of the process chamber; a holder for sustaining the substrate in the process chamber; and a substrate transfer plate for transferring the substrate to the holder; wherein the holder has a retainer for sustaining the substrate at its outer periphery and a main body for sustaining the retainer, a portion of the retainer extending at least from a back region thereof with respect to an inserting direction of the substrate transfer plate to a region adjacent thereto and to be sustained by the main body and lying outer than the substrate upon putting the substrate on the retainer being made thicker than other portions of the retainer.

17 Claims, 13 Drawing Sheets

U.S. PATENT DOCUMENTS

| | | | | |
|---|---|---|---|---|
| 6,113,165 A * | 9/2000 | Wen et al. | | 294/1.1 |
| 6,217,663 B1 * | 4/2001 | Inokuchi et al. | | 118/728 |
| 6,287,112 B1 * | 9/2001 | Van Voorst Vader et al. | | 432/258 |
| 6,364,957 B1 * | 4/2002 | Schneider et al. | | 118/728 |
| 6,435,799 B2 * | 8/2002 | Goodwin et al. | | 414/225.01 |
| 6,464,795 B1 * | 10/2002 | Sherstinsky et al. | | 118/728 |
| 6,540,837 B2 * | 4/2003 | Raaijmakers | | 118/715 |
| 6,615,113 B2 * | 9/2003 | Kretz et al. | | 700/258 |
| 6,635,157 B2 * | 10/2003 | Dordi et al. | | 204/198 |
| 6,780,251 B2 * | 8/2004 | Tometsuka | | 118/725 |
| 6,918,735 B2 * | 7/2005 | Urban et al. | | 414/729 |
| 7,033,168 B1 * | 4/2006 | Gupta et al. | | 432/253 |
| 7,201,280 B2 * | 4/2007 | Cho | | 211/41.18 |
| 7,207,763 B2 * | 4/2007 | Lee | | 414/217 |
| 7,252,738 B2 * | 8/2007 | Tong et al. | | 156/345.29 |
| 7,276,123 B2 * | 10/2007 | Shimizu et al. | | 118/719 |
| 7,316,721 B1 * | 1/2008 | Redden et al. | | 55/428 |
| 7,322,787 B2 * | 1/2008 | Hashimoto | | 414/754 |
| 7,455,734 B2 * | 11/2008 | Yamaguchi et al. | | 118/728 |
| 7,484,958 B2 * | 2/2009 | Kobayashi | | 432/258 |
| 2003/0000459 A1 * | 1/2003 | Park et al. | | 117/200 |
| 2003/0024477 A1 * | 2/2003 | Okuda et al. | | 118/723 IR |
| 2003/0170583 A1 * | 9/2003 | Nakashima et al. | | 432/241 |
| 2003/0173031 A1 * | 9/2003 | Aggarwal et al. | | 156/345.51 |
| 2004/0084301 A1 * | 5/2004 | Dordi et al. | | 204/252 |
| 2004/0099219 A1 * | 5/2004 | Park et al. | | 118/728 |
| 2005/0255717 A1 | 11/2005 | Takahashi | | |
| 2007/0026148 A1 * | 2/2007 | Arai et al. | | 427/248.1 |
| 2007/0275570 A1 * | 11/2007 | Nakamura et al. | | 438/795 |
| 2008/0206464 A1 * | 8/2008 | Kappeler | | 427/255.394 |
| 2008/0226830 A1 * | 9/2008 | Miyagi et al. | | 427/402 |

FOREIGN PATENT DOCUMENTS

| | | |
|---|---|---|
| JP | A-2001-313267 | 11/2001 |
| JP | A-2002-110771 | 4/2002 |
| JP | A-2005-086132 | 3/2005 |
| JP | A-2005-311291 | 11/2005 |
| TW | 232242 B | 5/2005 |
| TW | 234837 B | 6/2005 |
| TW | 235422 B | 7/2005 |

* cited by examiner

SUBSTRATE PROCESSING APPARATUS AND SEMICONDUCTOR DEVICE MANUFACTURING METHOD

TECHNICAL FIELD

The present invention relates to a substrate processing apparatus and semiconductor device manufacturing method for processing a semiconductor wafer, a glass substrate or the like.

BACKGROUND ART

There is known a substrate processing apparatus of this type having ring-formed retainers for supporting substrates, one by one, on a holder (boat) for sustaining a plurality of substrates. For example, a structure is known that has retainers to be placed in contact with a substrate only the backside thereof in a region corresponding to a region extending from the edge to device fabrication area of a substrate (e.g. Patent Document 1).

Patent Document 1: Japanese Patent Unexamined Publication No. 2005-86132

DISCLOSURE OF THE INVENTION

Problem that the Invention is to Solve

However, the retainer possibly suffers deformation in the course of thermal processing in spite of the effect to suppress the occurrence of slippage due to relaxing the tensile stress or own-weight stress through decentralizing the total weight of the substrate. This can be considered attributable to the stress concentration occurring at one point of the retainer due to the weight of the substrate on the retainer and the own weight of the retainer upon conducting a thermal process with the retainer set up on a main body (support pieces) of the boat. Due to the deformation of and the reduction in flatness of the retainer, creep deformation sometimes takes place in a part of the substrate put on the retainer, thus resulting in an occurrence of slippage.

It is an object of the present invention to provide a substrate processing apparatus whose retainer can be prevented from deforming thereby suppressing the occurrence of substrate slippage.

Means for Solving the Problem

According to a first aspect of the present invention, there is provided a substrate processing apparatus comprising: a substrate processing apparatus comprising: a process chamber for processing a substrate; a heater for heating an interior of the process chamber; a holder for sustaining the substrate in the process chamber; and a substrate transfer plate for transferring the substrate to the holder; wherein the holder has a retainer for sustaining the substrate at its outer periphery and a main body for sustaining the retainer, a portion of the retainer extending at least from a back region thereof with respect to an inserting direction of the substrate transfer plate to a region adjacent thereto and to be sustained by the main body and lying outer than the substrate upon putting the substrate on the retainer being made thicker than other portions of the retainer.

Preferably, the portion of the retainer lying outer than the substrate upon putting the substrate on the retainer is thicker than other portions throughout the retainer in its entirety.

Preferably, the back region of the retainer with respect to the inserting direction of the substrate transfer plate protrudes outer than other portions.

Preferably, the back region of the retainer with respect to the inserting direction of the substrate transfer plate is in a form to release a tip of the substrate transfer plate when a substrate is put on the retainer by the substrate transfer plate.

Preferably, the back region of the retainer with respect to the inserting direction of the substrate transfer plate is arranged in a portion lying outer than the substrate upon putting the substrate on the retainer.

Preferably, the back region of the retainer with respect to the inserting direction of the substrate transfer plate is a connecting portion through which different portions of the retainer are connected together, the connecting portion being arranged in a portion lying outer than the substrate upon putting the substrate on the retainer.

Preferably, the retainer is provided with a cutout in a part thereof on an inserting side of a substrate.

Preferably, the retainer is in a C-form.

Preferably, the holder is structured to sustain a plurality of substrates horizontally with spacing in a stack form.

Preferably, the thick walled portion of the retainer protrudes toward a surface thereof rather than the other portions.

According to a second aspect of the invention, there is provided a substrate processing apparatus comprising: a process chamber for processing a substrate; a heater for heating an interior of the process chamber; and a holder for sustaining the substrate within the process chamber; wherein the holder has a retainer for sustaining the substrate at its outer periphery and a main body for sustaining the retainer, the retainer having a protrusion at least in a part thereof that protrudes outer than other parts, a portion of the retainer extending at least from the protrusion and the other parts to a region adjacent thereto and beyond connections between the protrusion and lying outer than the substrate upon putting the substrate on the retainer being thicker than other portions of the retainer.

According to a third aspect of the invention, there is provided a holder comprising: a retainer for sustaining a substrate at an outer periphery thereof; and a main body for sustaining the retainer wherein retainer has a protrusion at least in a part thereof that protrudes outer than other parts, a portion of the retainer extending at least from the protrusion to a region adjacent thereto and beyond connections between the protrusion and lying outer of the substrate upon putting the substrate on the retainer being thicker than other portions of the retainer.

According to a fourth aspect of the invention, there is provided a holder comprising: a retainer for sustaining a substrate at an outer periphery thereof; and a main body for sustaining the retainer; wherein retainer has a protrusion at least in a part thereof that protrudes outer than other parts, a portion of the retainer extending at least from the protrusion to a region adjacent thereto and beyond connections between the protrusion and the other parts and lying outer than the substrate upon putting the substrate on the retainer being thicker than other portions of the retainer.

According to a fifth aspect of the invention, there is provided a retainer for sustaining a substrate at an outer periphery thereof and to be sustained by a main body, the retainer comprising: a protrusion provided at least in a part thereof that protrudes outer than other parts, a portion of the retainer extending at least from the protrusion to a region adjacent thereto and to be sustained by the main body and lying outer than a substrate upon putting the substrate on the retainer being thicker than other portions of the retainer.

According to a sixth aspect of the invention, there is provided a retainer for sustaining substrate at an outer periphery thereof, the retainer comprising: a protrusion provided at least in a part thereof that protrudes outer than other parts, a portion of the retainer extending at least from the protrusion to a region adjacent thereto and beyond connections between the protrusion and the other portions and lying outer than the substrate upon putting the substrate on the retainer being thicker than other portions of the retainer.

According to a seventh aspect of the invention, there is provided a semiconductor device manufacturing method comprising: sustaining a substrate by a holder having a retainer for sustaining the substrate at its outer periphery and a main body for sustaining the retainer, the retainer having a portion extending at least from a back region thereof with respect to an inserting direction of the substrate transfer plate to a region adjacent thereto and to be supported by the main body and lying outer of the substrate upon putting the substrate on the retainer being made thicker than other portions of the retainer; loading the substrate sustained on the holder into a process chamber; thermally processing the substrate sustained on the holder within the process chamber; and unloading the substrate processed out of the process chamber.

According to an eighth aspect of the invention, there is provided a semiconductor device manufacturing method comprising: sustaining a substrate by a holder having a retainer for sustaining the substrate at its outer periphery and a main body for sustaining the retainer, the retainer having a protrusion in a part thereof that protrudes outer than other parts, a portion of the retainer extending at least from the protrusion to a region adjacent thereto and beyond connections between the protrusion and lying outer of the substrate upon putting the substrate on the retainer being thicker than other portions of the retainer; loading the substrate sustained by the holder into a process chamber; thermally processing the substrate sustained on the holder in the process chamber; and unloading the substrate processed out of the process chamber.

EFFECT OF THE INVENTION

According to the invention, the retainer is made thicker, than other portions, in a portion extending at least from a back region thereof with respect to an inserting direction of the substrate transfer plate to a region adjacent thereto and to be supported by the main body which portion when a substrate is put on the retainer lies outer of the substrate. This suppresses the stress concentration on the retainer and hence prevents the deformation of the retainer. Therefore, the retainer can be kept flat thus suppressing the occurrence of substrate slippage.

DESCRIPTION OF REFERENCE NUMERALS AND SIGNS

Figure 1:
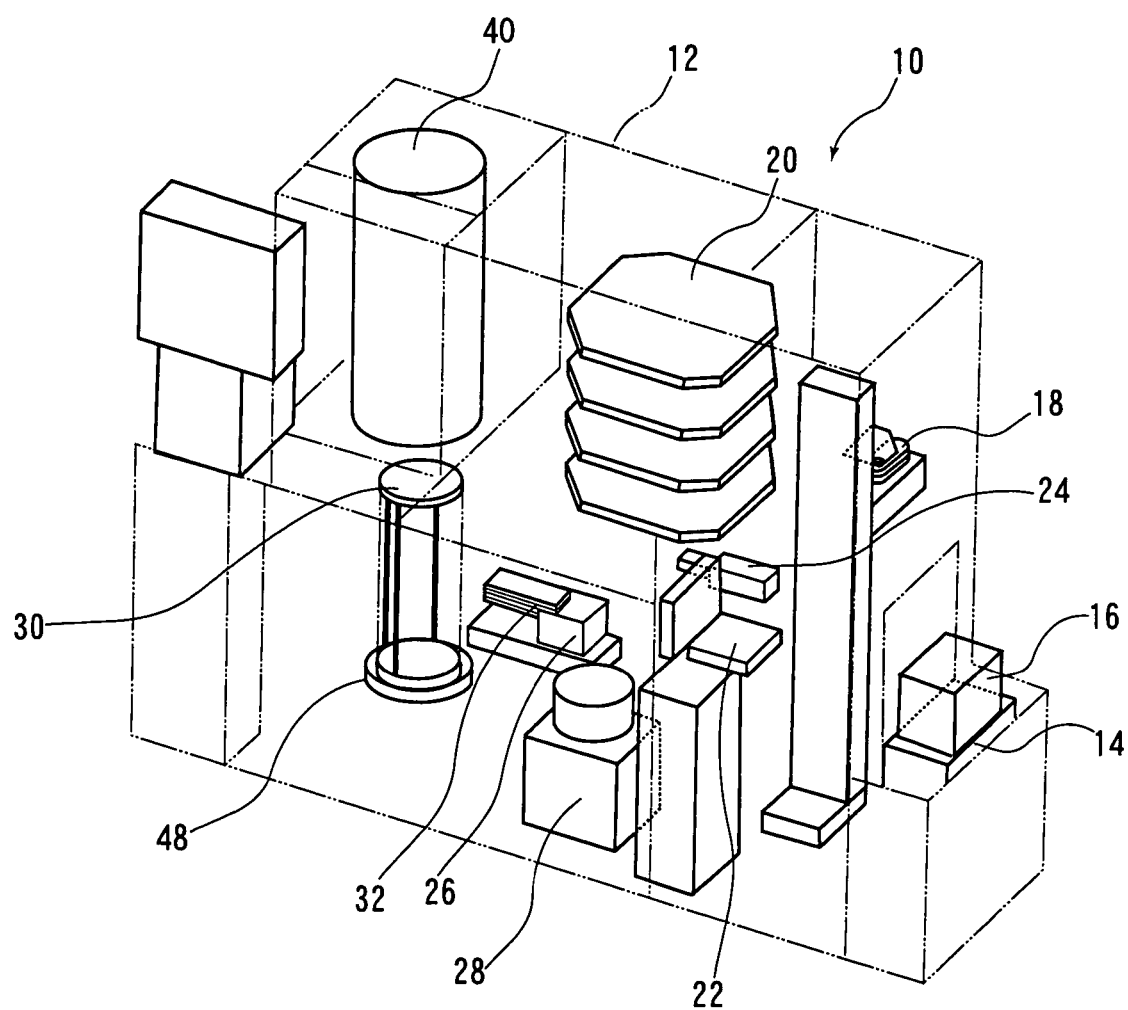
FIG. 1 is a perspective view showing a substrate processing apparatus according to an embodiment of the present invention.

10 Substrate processing apparatus
12 Housing
14 Pod stage
16 Pod
18 Pod carrier
20 Pod shelf
22 Pod opener
24 Substrate count detector
26 Substrate transferer
28 Notch aligner
30 Holder
32 Substrate transfer plate
32a Convex
34 Holder body
40 Reactor
42 Reactor tube
43 Reactor vessel
44 Adapter 45 Process chamber
46 Heater
48 Reactor seal cap
50 Second heat-insulation plate
52 First heat-insulation plate
54 Substrate
56 Gas inlet port
59 Gas outlet port
60 Gas inlet pipe
62 Gas outlet pipe
64 Gas introduction passage
66 Nozzle
70 Controller
72 Upper plate
74 Lower plate
76 Pillars
78 Support pieces
80 Ring member
80a Substrate support portion
80b Substrate support portion
80c Connecting portion
80d Thick-walled portion
82 Cutout
84 Concave
86 Curve portion
88 Straight-line portion

BEST MODE FOR CARRYING OUT THE
INVENTION

Based on the drawings, embodiments of the present invention will now be explained.

FIG. 1 shows an example of substrate processing apparatus 10 according to an embodiment of the invention. Substrate processing apparatus 10 is a batch-type vertical thermal processing apparatus having housing 12 in which the major part thereof is arranged. Housing 12 is connected with pod stage 14 at the front thereof so that pod 16 can be conveyed to pod stage 14. Pod 16 contains therein twenty-five wafers for example, as substrates to process, and is set up at pot stage in a state closed with a lid, not shown.

Pot transporter 18 is arranged within housing 12 in a position frontward thereof and opposite to pot stage 14. In the vicinity of pod carrier 18, there are arranged pod shelf 20, pod opener 22 and substrate-count detector 24. Pod shelf is arranged above pod opener 22 while substrate-count detector 24 is arranged adjacent to pod opener 22. Pod carrier is to convey pod 16 between pod stage 14, pod shelf 20 and pod opener 22. Pod opener 22 is to open the lid of pod 16. The substrates in pod 16 opened at the lid are detected in the number by substrate-count detector 24.

Furthermore, within housing 12, there are arranged substrate transferer 26, notch aligner 28 and holder (boat) 30. Substrate transferer 26 has substrate-transfer plate (arm) 32 capable of taking out five substrates for example. By moving substrate transfer plate 32, the substrate is conveyed between pod 16 placed at pod opener 22, notch aligner 28 and holder 30. Notch aligner 28 is to detect a notch or orientation flat formed in the substrate and to align the substrate at its notch or orientation flat in a given position. Meanwhile, holder 30 has a plurality of ring members 80 (referred later using FIG. 3 for example) holding substrates side by side, to sustain a plurality of substrates horizontally with spacing in a stack form.

Furthermore, reactor 40 is arranged within housing 12 in a position upper rear thereof. Holder 30, carrying a plurality of substrates, is to be loaded into reactor 40, to carry out thermal processing.

Figure 2:
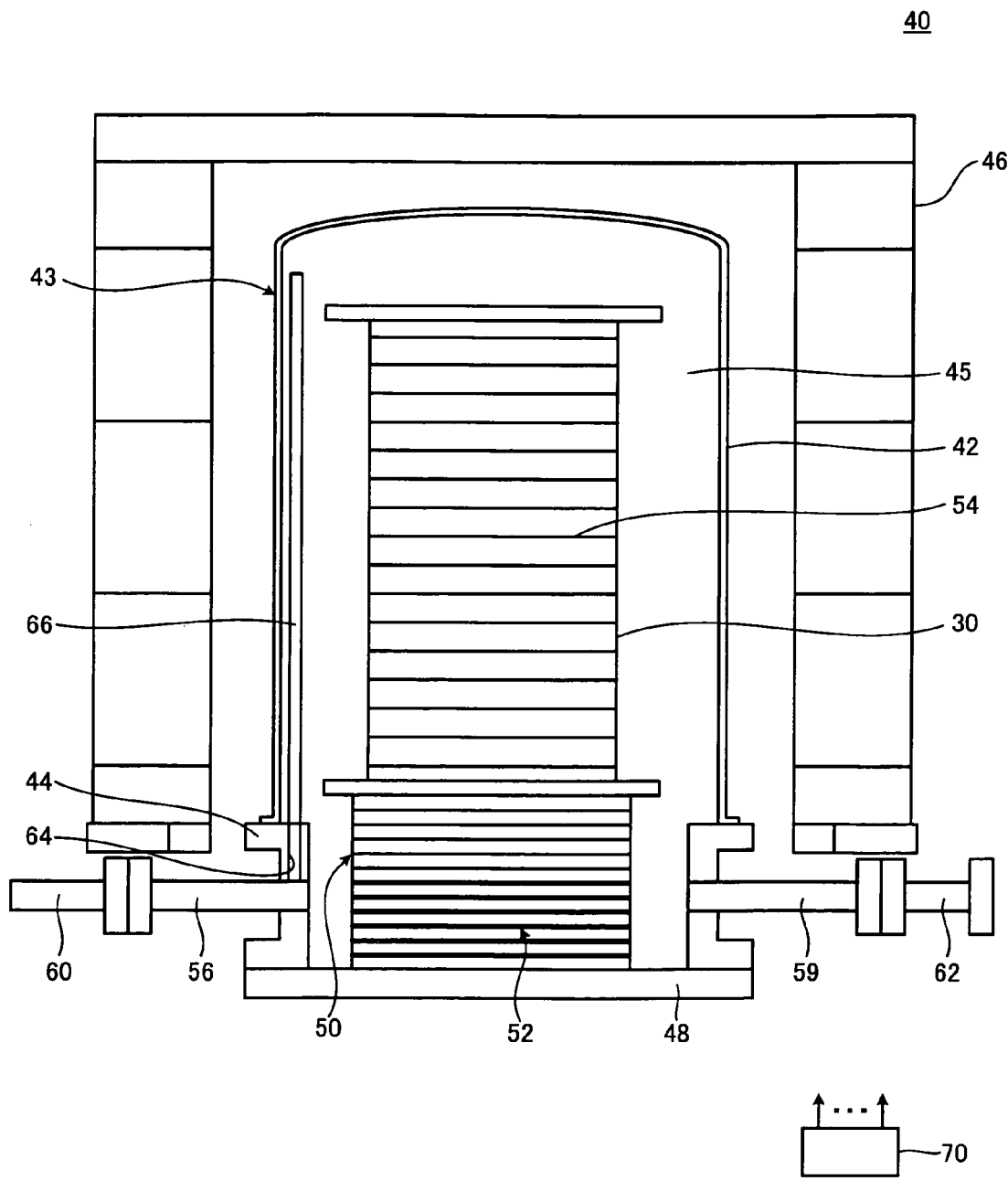
FIG. 2 is a vertical sectional view of a reactor of the substrate processing apparatus according to the embodiment of the invention.

FIG. 2 shows an example of reactor 40. Reactor 40 has reactor tube 42 formed of silicon carbide (SiC). Reactor tube 42 is in a circular cylindrical form closed at the upper end and opened at the lower end, having the opened lower end formed flanged. In the beneath of reactor tube 42, quartz adapter 44 is arranged in a manner supporting reactor tube 42. Adapter 44 is in a circular cylindrical form opened at the upper and lower ends, whose opened upper and lower ends are formed flanged. The lower flange of reactor tube 42 is in abutment at its lower surface against the upper surface of the upper flange of adapter 44. Reactor tube 42 and adapter 44 form rector vessel 43. In reactor vessel 43 (reactor tube 42), process chamber 45 is provided to process a plurality of substrates. Meanwhile, in a region around reactor tube 42 excepting adapter 44 out of reactor vessel 43, heater 46 is arranged to heat the interior of process chamber 45.

Reactor vessel 43, formed by reactor tube 42 and adapter 44, is opened in its lower part in order to receive holder 30 therein. The opening (reactor aperture) is hermetically closed by abutting reactor seal cap 48 against the lower surface of the lower flange of adapter 44 through an O-ring. Reactor seal cap 48 is provided to support holder 30, to be moved up and down together with holder 30. Between reactor seal cap 48 and holder 30, there are provided first heat-insulation member 52 formed of quartz and second heat-insulation member 50 arranged above first heat-insulation member 52 and formed of silicon carbide (SiC). Holder 30 carries a multiplicity of, 25-100 for example, substrates nearly horizontally with spacing in a stack manner and is to be loaded into reactor tube (process chamber 45) 42.

Reactor tube 42 is formed of silicon carbide (SiC) in order to enable the processing at a temperature of 1200° C. or higher. In case the SiC reactor tube 42 is made extending up to the reactor aperture and reactor aperture is structured sealed with reactor seal cap 48 through an O-ring, the seal region is raised in temperature by the heat conducted through SiC reactor tube 42, which possibly fuse the O-ring of a seal material. In case the seal region of SiC reactor tube 42 is cooled in order not to fuse the O-ring, SiC reactor tube 42 is broken by the difference of thermal expansion due to temperature difference. For this reason, by structuring reactor vessel 43 in its region to be heated by heater 46 with SiC reactor tube 42 and structuring the region off the region to be heated by heater 46 with quartz adapter 44, the heat transfer from SiC reactor tube 42 is relieved thus enabling the sealing at the reactor aperture without causing fusion of the O-ring and breaking of reactor tube 42. Concerning the seal between SiC reactor tube 42 and quartz adapter 44, if both are improved in surface accuracy, thermal expansion is given isotropic freely from temperature difference because SiC reactor tube 42 is arranged in the region to be heated by heater 46. Accordingly, because flatness is to be kept at the flange in the lower end of SiC reactor tube 42 in a manner not to cause a gap with adapter 44, sealability is secured by merely placing SiC reactor tube 42 on quartz adapter 44.

Adapter 44 is provided integrally with gas inlet port 56 and gas outlet port 56. Gas inlet port 56 is connected with gas inlet pipe 60 while gas outlet port 59 is with gas outlet pipe 62.

Adapter 44 has an inner wall lying inner than (protruding from) the inner wall of reactor tube 42. Adapter 44 has a sidewall (thick-walled portion) in which gas inlet passage 64 is provided in communication with gas inlet port 56 and extending vertically so that, in the upper part thereof, a nozzle mount hole is provided opened to the upper. The nozzle mount hole is opened in the upper surface of adapter 44 on its upper flange side at the inside of reactor tube 42, thus being in communication with gas inlet port 56 and gas inlet passage 64. Nozzle 66 is inserted and fixed in the nozzle mount hole. Namely, nozzle 66 is connected in the upper surface of adapter 44 in a portion protruding inner than the inner wall of reactor tube 42 so that nozzle 66 is supported by the upper surface of adapter 44. Owing to this structure, the nozzle connecting region is not readily deformed nor broken by heat. Meanwhile, there is also a merit that nozzle 66 and adapter 44 are easy to assemble and dismantle. The process gas, introduced to gas inlet port 56 through gas inlet pipe 60, is supplied to the interior of reactor tube 42 through gas inlet passage 64 provided in the sidewall of adapter 44 and nozzle 66. Incidentally, nozzle 66 is structured extending to the upper than the upper end of a substrate arrangement region along the inner wall of reactor tube 42, i.e. up to the above of the upper end of holder 30.

Now explanation is made on the operation of substrate processing apparatus 10 constructed as above, i.e. a substrate treating process to be implemented as one of semiconductor device-manufacturing and substrate-fabrication processes by use of substrate processing apparatus 10.

Note that the operation of various parts constituting substrate processing apparatus 10 is to be placed under control of controller 70.

At first, after pod 16 containing a plurality of substrates 54 is set up at pod stage 14, pod carrier 18 conveys pod 16 from pod stage 14 to pod shelf 20 and stocks it on pod shelf 20. Then, pod carrier 18 conveys pod 16, stocked on pod shelf 20, to pod opener 22 and sets up it thereon. Pod opener 22 opens the lid of pod 16 and substrate-count detector 24 detects the number of substrates 54 contained in pod 16.

Then, substrate transferer 26 takes substrates 54 out of pod 16 resting on pod opener 22 and transfers those to notch aligner 28. Notch aligner 28 detects a notch while rotating substrate 54 and aligns a plurality of substrates 54 in the same position at the notches based on the detected information. Then, substrate transferer 26 takes substrates 54 out of notch aligner 28 and transfers those onto holder 30. Namely, by means of a plurality of ring members 80 (referred later) provided in holder 30, a plurality of substrates are horizontally held one by one with spacing in a stack form (substrate support step).

After transferring a batch of substrates 54 to holder 30 in this manner, holder 30 carrying a plurality of substrates 54 at ring members 80 (referred later) is loaded into reactor 40 (process chamber 45) where temperature is set, for example, at around 600° C., followed by hermetically sealing the interior of reactor 40 with use of reactor seal cap 48 (substrate load step). Then by raising the interior temperature of the reactor up to a thermal processing temperature, process gas is introduced from gas inlet pipe 60 into reactor tube 42 through gas inlet pipe 56, gas inlet passage 64 provided in the sidewall of adapter 44 and nozzle 66. The process gas contains nitrogen ($N_2$), argon (Ar), hydrogen ($H_2$), oxygen ($O_2$) and the like. When thermally processing substrates 54 in process chamber 45, substrates 54 held on ring members 80 (referred later) are heated up to a temperature of approximately 1200° C. or higher (thermal process step).

Completing the thermal processing of substrates 54, the reactor interior temperature is lowered down to 600° C. Thereafter, holder 30, carrying thermally-processed substrates 54 at ring members 80 (referred later), is unloaded out of reactor 40 (process chamber 45) (substrate unload step). Holder 30 is placed in standby in a predetermined location until all the substrates 54 held on holder 30 cool down. Then, after substrates 54 on holder 30 placed in standby are cooled down to a predetermined temperature, substrate transferer 26 takes substrates 54 out of holder 30 and conveys those to empty pod 16 located at pod opener 22 thus putting those therein. Then, pod carrier 18 conveys pod 16 containing substrates 54 to pod shelf 20 or pod stage 14, thus completing a series of process steps.

Now holder 30 is explained.

Figure 3:
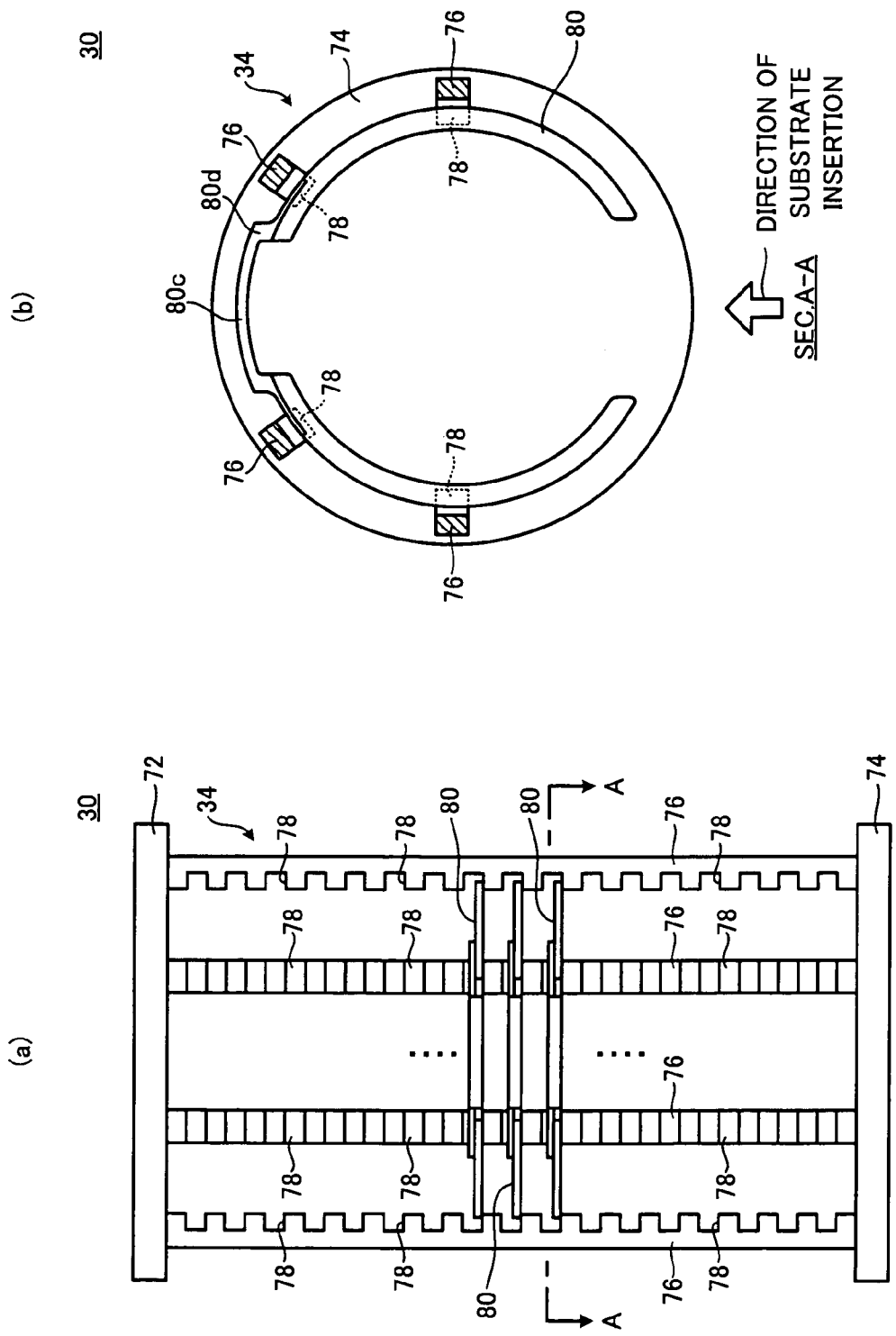
FIG. 3 is a view showing a holder of the substrate processing apparatus according to the embodiment of the invention, wherein (a) shows a front view while (b) a sectional view taken on line A-A in (a).

FIG. 3 shows an example of holder 30. Holder 30 has ring members 80 serving as retainers, hereinafter referred, and holder body 34 serving as a main body to support ring members 80. Holder body 34 is formed of silicon carbide or silicon (single crystal or polycrystal), having upper plate 72, lower plate 74 and four pillars 76, 76, 76, 76, for example, connecting upper and lower plates 72, 74 together. Pillar 76, 76, 76, 76 are formed with support pieces (claws) 78, 78, 78, 78 for supporting ring members 80. Support pieces 78, 78, 78, 78 extend horizontally from pillars 76, 76, 76, 76 toward the inward (toward the axis) of holder body 34, thus being formed plurality in the number in pillars 76, 76, 76, 76 at a vertically constant interval.

Pillars 76, 76, 76, 76 are provided two in the number on the side of substrate insertion (arrow direction in FIG. 3(*b*), i.e. on the side closer to substrate insertion) as viewing holder body 34 from above, and two in the number on the side opposite to the side of substrate insertion (on the side not closer to substrate insertion). Specifically, two pillars 76, 76 on the substrate-insertion side are provided spaced nearly 180 degrees on the side of substrate insertion while two pillars 76, 76 on the side opposite to the substrate-insertion side are provided between two pillars 76, 76 on the substrate-insertion side. Ring members 80, referred later, are to be put respectively by support pieces 78, 78, 78, 78 of pillars 76, 76, 76, 76 as shown in FIG. 3(*a*).

Now explanation is made on ring member 80 in the first embodiment of the invention.

Figure 4:
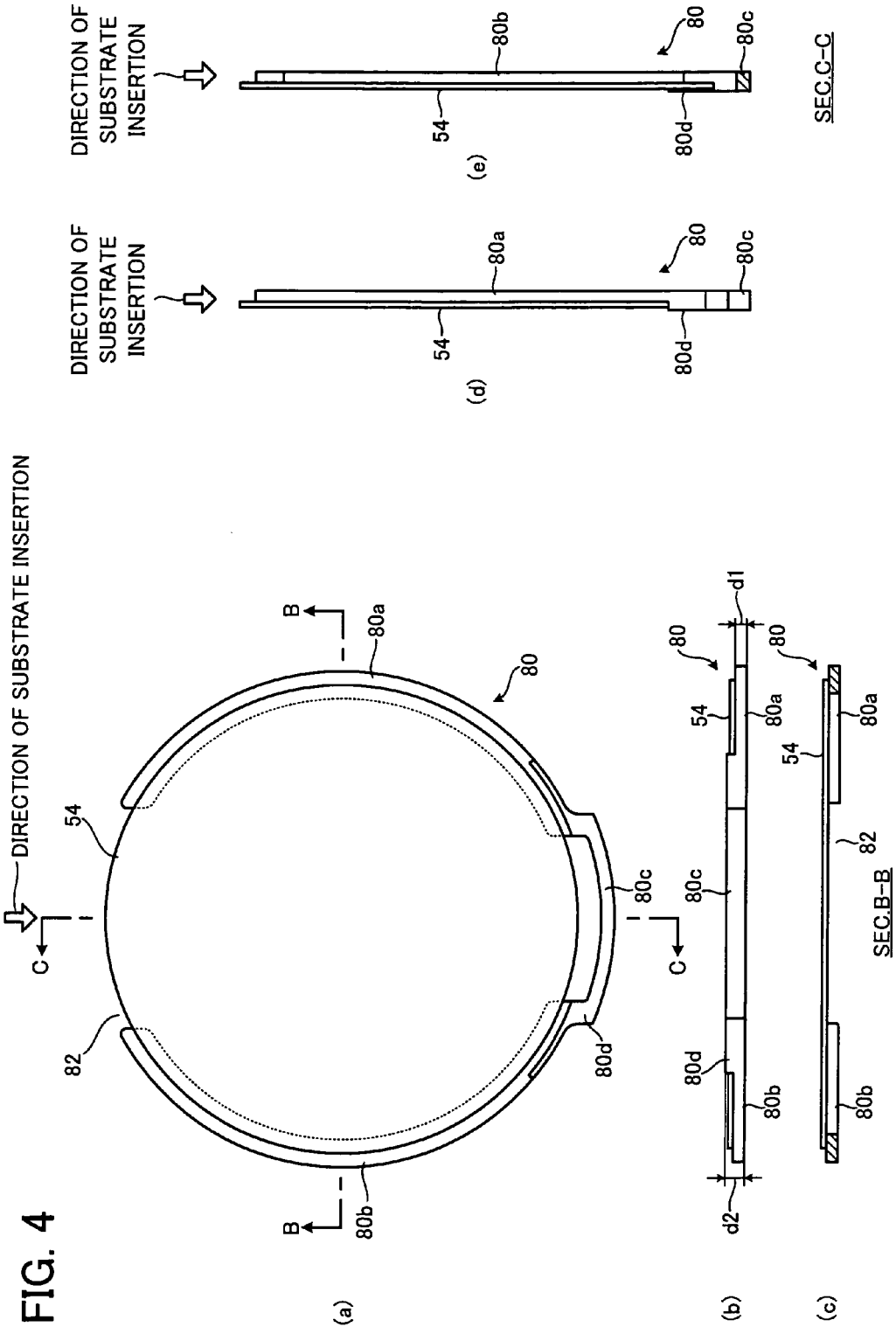
FIG. 4 is a view showing a ring member in a first embodiment of the invention, wherein (a) shows a top view, (b) a front view, (c) a sectional view taken on line B-B in (a), (d) a side view and (e) a sectional view taken on line C-C in (a).
Figure 5:
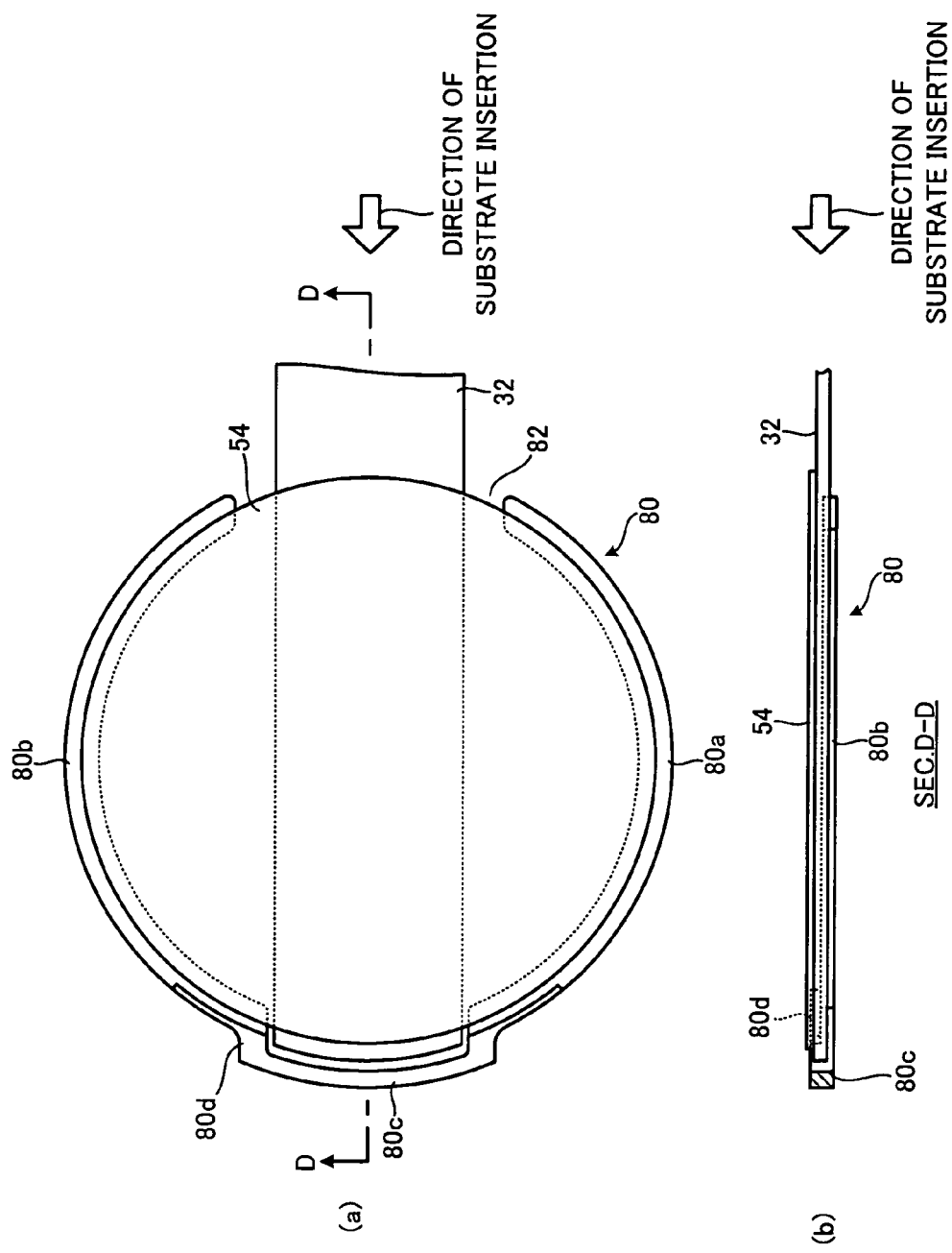
FIG. 5 is a view showing a state that a substrate transfer plate is inserted into the ring member of the first embodiment of the invention, wherein (a) shows a top view while (b) a sectional line taken on line D-D in (a).

FIGS. 4 and 5 show ring member 80 of the first embodiment.

As shown in FIG. 4, ring member 80 is in an annular form (C-form) partially cut away, to support the outer periphery of substrate 54. Ring member 80 is formed, for example, of quartz, silicon or silicon carbide. Cutout 82 is formed in ring member 80 in a part on the side of substrate insertion (in the front with respect to the direction of substrate insertion, i.e. to the arrow in FIG. 4). Substrate transfer plate 32 is to be inserted in the region opened by cutout 82. Meanwhile, ring member 80 is structured with, for example, two substrate support portions 80*a*, 80*b* to contact with the backside of substrate 54 thereby supporting the substrate 54 (having substrate retaining surface to support substrate 54) and connecting portion 80*c* that connects between the different portions of ring member 80, i.e. between substrate support portion 80*a* and substrate support portion 80*b*.

As also shown in FIG. 5, connecting portion 80*c* is formed in the back of ring member 80 with respect to the direction of substrate transfer plate insertion and arranged in a position outer than substrate 54 in the case substrate 54 is put on ring member 80 by substrate transfer plate 32.

Incidentally, substrate transfer plate 32 is to transfer substrate 54 while supporting its edge (periphery) with a taper surface (not shown) of substrate transfer plate 32 thereby preventing substrate 54 from being damaged at its backside. Consequently, substrate transfer plate 32 has a tip protruding outer than substrate 54. Accordingly, connecting portion 80*c* protrudes outward rather than the other portions (substrate support portions 80*a*, 80*b*) of ring member 80, thus being made in a form that substrate transfer plate 32 is to be released at its tip when placing substrate 54 on ring member 80.

Meanwhile, ring member 80 is made thicker, than the other, in a portion extending from at least the back thereof with respect to the direction of substrate transfer plate insertion to a region adjacent thereto and to be supported by holder body 34, wherein the portion is in a position outer than substrate 54 when substrate 54 is placed on ring member 80.

Specifically, thick-walled portion 80d is formed in connecting portion 80c and part of substrate support portions 80a, 80b adjacent to connecting portions 80c. Thick-walled portion 80d has a thickness (d2 in FIG. 4(b)) greater than the thickness of the other portion than thick-walled portion 80d of ring member 80, specifically than the thickness of substrate support portions 80a, 80b where thick-walled portion 80d is not formed (d1 in FIG. 4(b)). Meanwhile, as shown also in FIGS. 3(b) and 4(a), thick-walled portion 80d is formed in ring member 80 in a portion extending from connecting portion 80c to regions to be supported by support pieces 78 of holder body 34 in the case placing ring member 80 in holder 30 (FIG. 3(b)) and outer than the outer edge of substrate 54 placed on ring member 80 (FIG. 4(a)).

Figure 6:
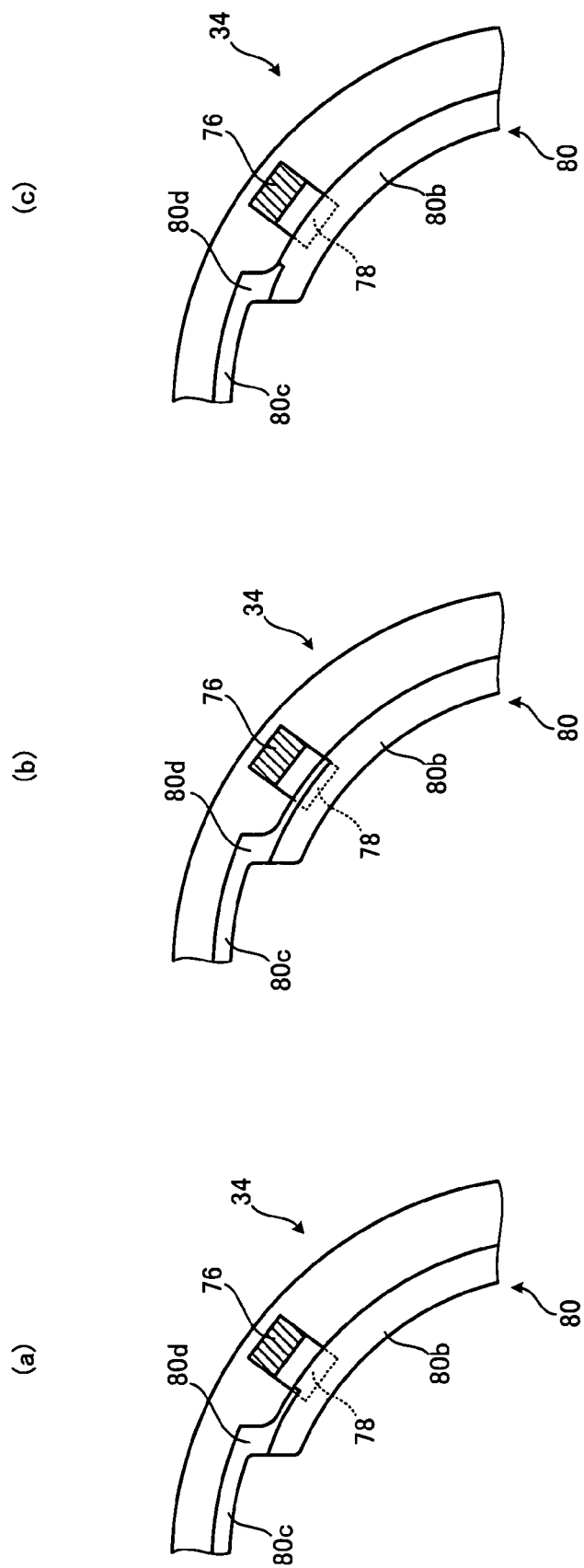
FIG. 6 is a view showing a modification of the ring member according to a first embodiment of the invention, wherein (a), (b) and (c) each illustrates the region where a thick-walled portion is provided.

Incidentally, where providing thick-walled portion 80d in a region extending from an outward protrusion in the back of ring member 80 with respect to the direction of substrate insertion to a portion adjacent thereto and to be supported by support pieces 78, thick-walled portion 80d is satisfactorily provided to be caught in any part of the support pieces 78 as shown in FIG. 6(b). Furthermore, as shown in FIG. 6(b), thick-walled portion 80d is preferably provided to be caught entirely by the support pieces 78 as shown in FIG. 6(b) because no stress concentrations occur in ring member 80.

Meanwhile, as shown in FIG. 6(c), thickness is provided greater in a portion, lying outer than substrate 54, extending from an outward protrusion in the back of ring member 80 with respect to the direction of substrate insertion to regions beyond the corners (connections) between the protrusion and the other portions, than the other portion. This can eliminate stress concentration from occurring at the corners (connections) between the outer protrusion directed toward the back with respect to the direction of substrate insertion and the other portion.

Figure 11:
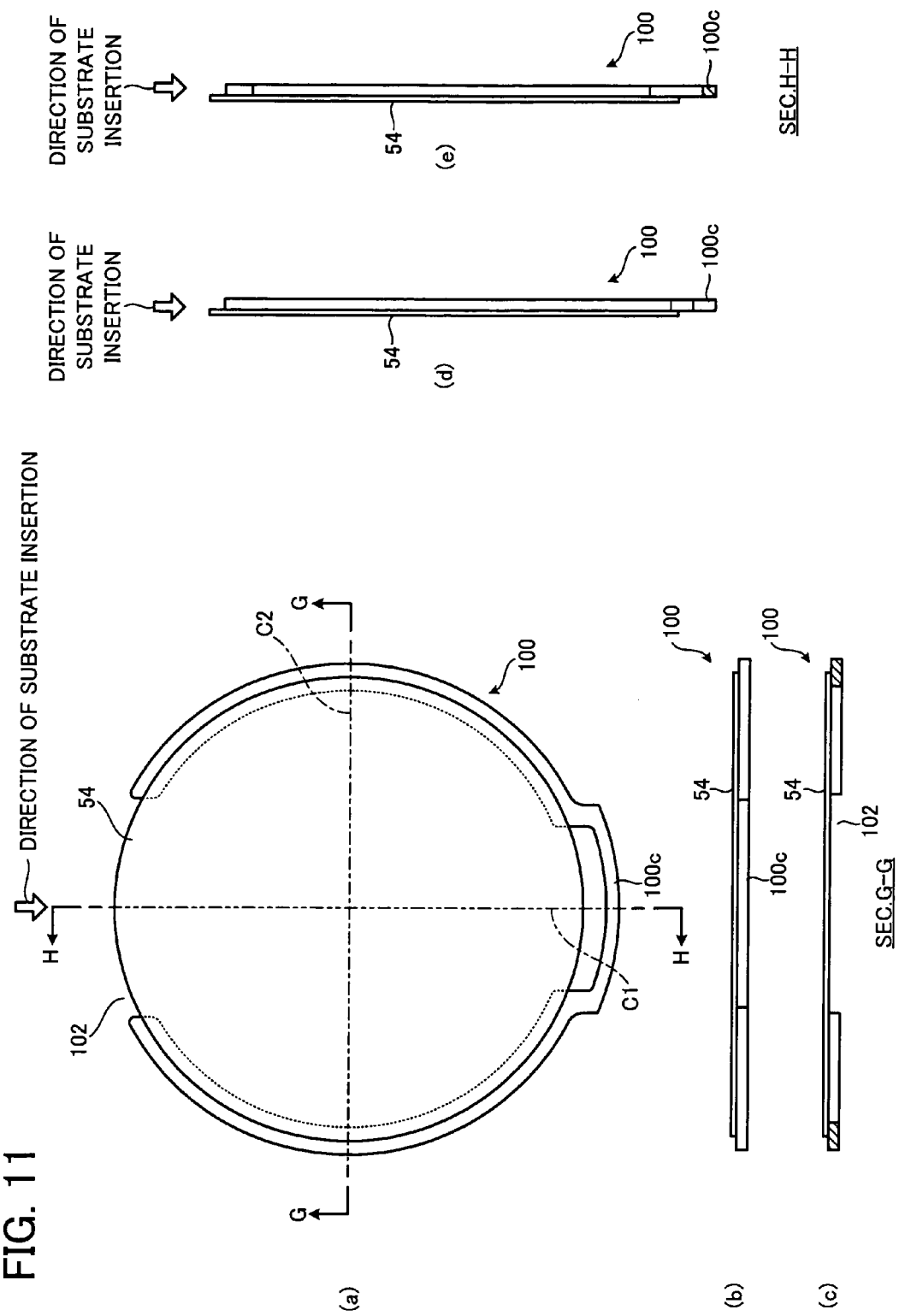
FIG. 11 is a view showing a ring member of a first comparative example, wherein (a) shows a top view, (b) a front view, (c) a sectional view taken on line G-G in (a), (d) a side view and (e) a sectional line taken on line H-H in (a).
Figure 12:
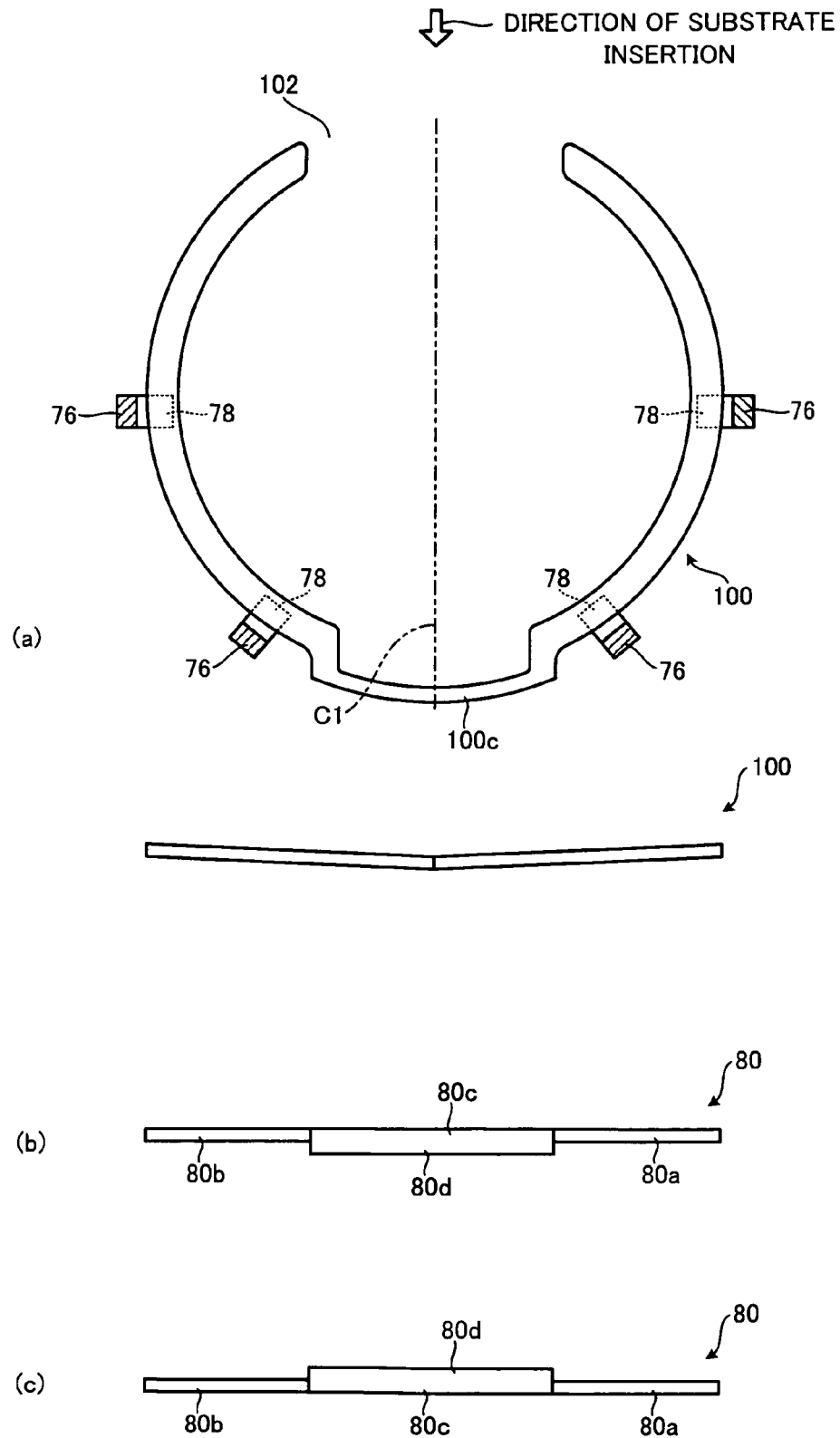
FIG. 12 shows the ring member of the first comparative example in comparison with a thick-walled ring member, wherein (a) shows top and front views of the ring member of the first comparative example, (b) a front view illustrating a ring member provided with a thick-walled portion in the back surface thereof and (c) a front view illustrating a ring member provided with a thick-walled portion in the main surface thereof.
Figure 13:
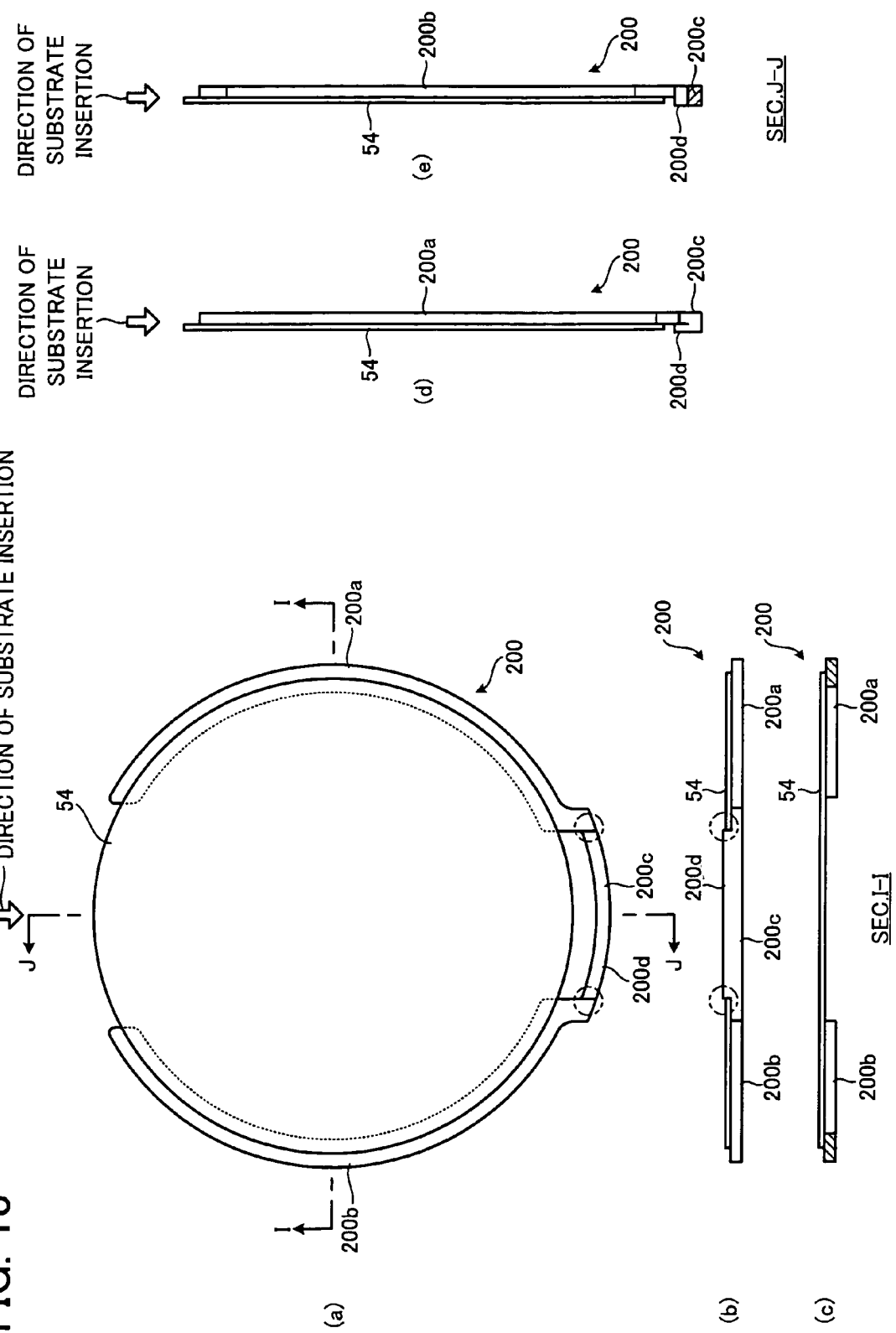
FIG. 13 is a view showing a ring member of a second comparative example, wherein (a) shows a top view, (b) a front view, (c) a sectional view taken on line I-I in (a), (d) a side view and (e) a sectional line taken on line J-J in (a).

Now explanation is made on first and second comparative examples, based on FIGS. 11 to 13.

FIG. 11 shows ring member 100 according to a first comparative example.

As shown in FIG. 11, ring member 100 in the first comparative example is not formed with a thick-walled portion in ring member 100 but formed uniform in thickness in the entirety of ring member 100 (e.g. in a thickness equal to d1 in FIG. 4(b)) as compared to ring member 80 according to the present embodiment.

In ring members 100 of the first comparative example, when ring member 100 is placed in holder body 34 and subjected to thermal processing, stress concentration occurs in a part of ring member 100 due to the own weight of ring member 100 and the weight of substrate 54 placed on ring member 100. Specifically, it can be considered that stress concentration occurs in the vicinity of a centerline C1 (two-dot chain line in FIG. 11) of ring member 100 to thereby deform ring member 100 about the centerline C1.

On the contrary, in ring member 80 of the present embodiment, because thick-walled portion 80d is provided, greater in thickness than the other portion, in the region to cause deformation in ring member 100 of the first comparative (in the region of connection 100c), deformation can be prevented in ring member 80. This can maintain the flatness of ring member 80 thereby making it possible to suppress the substrate 54 from slipping.

Meanwhile, as shown in FIG. 12, where ring member 100 of the first comparative example is held at four points, ring member 100 deforms about the centerline C1 (FIG. 12(a)). Taking account of the manner of such deformation, thick-walled portion 80d is preferably provided in a manner rising in the main surface of ring member 80 (in a manner convexing upwardly) rather than rising in the back surface thereof (in a manner convexing downwardly) because deformation is not ready to occur.

FIG. 13 shows ring member 200 according to a second comparative example.

As shown in FIG. 13, ring member 200 in the second comparative example is formed with a thick-walled portion 200s only in connecting portion 200c of ring member 200 without forming a thick-walled portion 200d in substrate support portions 200a, 200b adjacent to connecting portion 200c as compared to ring member 80 according to the present embodiment.

In ring member 200 of the second comparative example, such deformation as encountered in the first comparative example does not occur because connecting portion 200c is made thicker than the other portion. However, it can be considered that stress concentration occurs at the corners of joints between connecting portion 200c and substrate support portions 200a, 200b (e.g. region surrounded by the two-dot chain line in FIGS. 13(a) and 13(b)) from which region deformation occurs in ring member 200.

On the contrary, in ring member 80 of the present embodiment, thickness is provided greater (the thick-walled portion 80d is formed), than the other portion, in not only the back thereof (connecting portion 80c) with respect to the direction of substrate transfer plate 32 insertion but also in a portion extending from the back thereof with respect to the direction of substrate transfer plate 32 insertion to a point corresponding to a back of holder body 34 (on the side opposite to substrate insertion) corresponding to support piece 78, i.e. at least a portion extending up to a point that ring member 80 is supported by holder body 34. Therefore, this structure can prevent the stress concentration from occurring at the connections between connecting portion 80c and substrate support portions 80a, 80b and hence the deformation resulting therefrom.

Now explanation is made on ring member 80 of the second embodiment.

Figure 7:
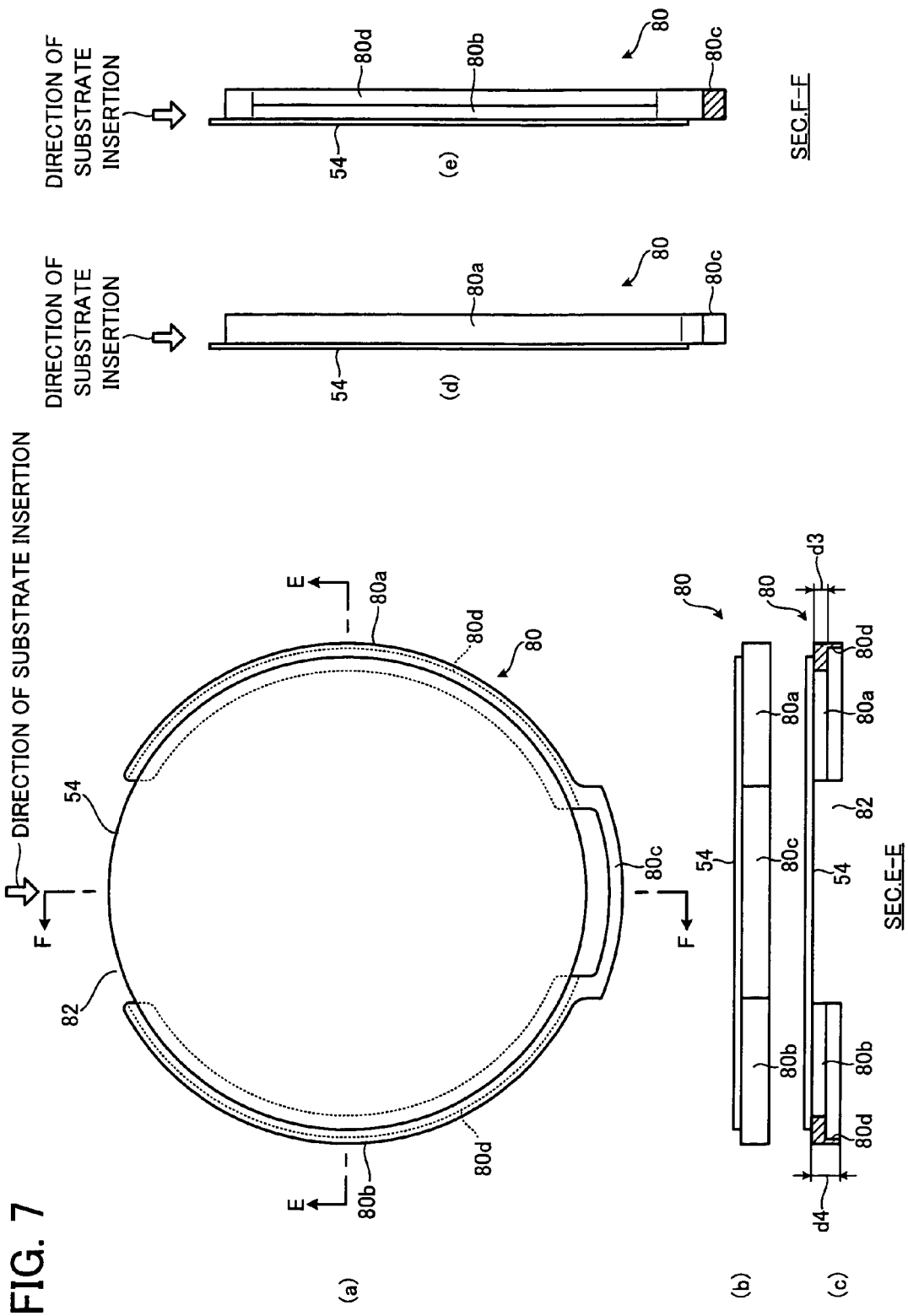
FIG. 7 is a view showing a ring member according to the second embodiment of the invention, wherein (a) shows a top view, (b) a front view, (c) a sectional view taken on line E-E in (a), (d) a side view and (e) a sectional view taken on line F-F in (a).

FIG. 7 shows ring member 80 of the second embodiment.

Ring member 80 of the second embodiment is different in the region where thick-walled portion 80d is provided from ring member 80 of the first embodiment. Ring member 80 of the second embodiment is similar to ring member 80 of the first embodiment in respect of the other structure.

As shown in FIG. 7, ring member 80 of the second embodiment is formed thicker, throughout ring member 80, in a portion of ring member 80 that is outer than substrate 54 in the case substrate 54 is placed on ring member 80, than the other portion.

Specifically, thick-walled portion 80d is formed throughout a region including connecting portion 80c and substrate support portions 80a, 80b adjacent to connecting portion 80c. The thick-walled portion 80d has a thickness (d4 in FIG. 6(c)) greater than the thickness (d3 in FIG. 6(c)) in the other portion of ring member 80 than thick-walled portion 80d, specifically the thickness of substrate support portion 80a, 80b in a portion free of thick-walled portion 80d formed. Meanwhile, the thick-walled portion 80d is formed throughout the entire periphery in the backside of ring member 80 and outer than the outer edge of substrate 54 upon placing substrate 54 on ring member 80.

In the meanwhile, in ring member 100 of the first comparative example, when ring member 100 is placed on holder body 34 and subjected to thermal processing, stress concentration possibly occurs not only in the vicinity of the centerline C1 (two-dot chain line in FIG. 11) of ring member 100 but also in the vicinity of the centerline C2 (one-dot chain line in FIG. 11) of ring member 100. It can be considered that this deforms ring member 100 about the centerline C1 but also deforms ring member 100 about the centerline C2 (ring member 100 deformed at its tip (cutout 102 and around) downwardly).

On the contrary, in ring member 80 of the present embodiment, thickness is provided greater (thick-walled portion 80*d* is formed) throughout ring member 80 in a portion lying outer than substrate 54 upon placing substrate 54 on ring member 80, than the other portion, thereby preventing deformation from occurring in the entire of ring member 80. This can maintain the flatness of ring member 80 and hence suppress the substrate 54 from slipping.

Meanwhile, in order to prevent the deformation in ring member 100 of the first comparative example, it can be considered to increase the thickness entirely in ring member 100. Accordingly, explanation is made with comparison between ring member 80 of the present embodiment and ring member 300 according to a third comparative example increased in thickness entirely in the ring member (referred later using FIG. 8).

Figure 8:
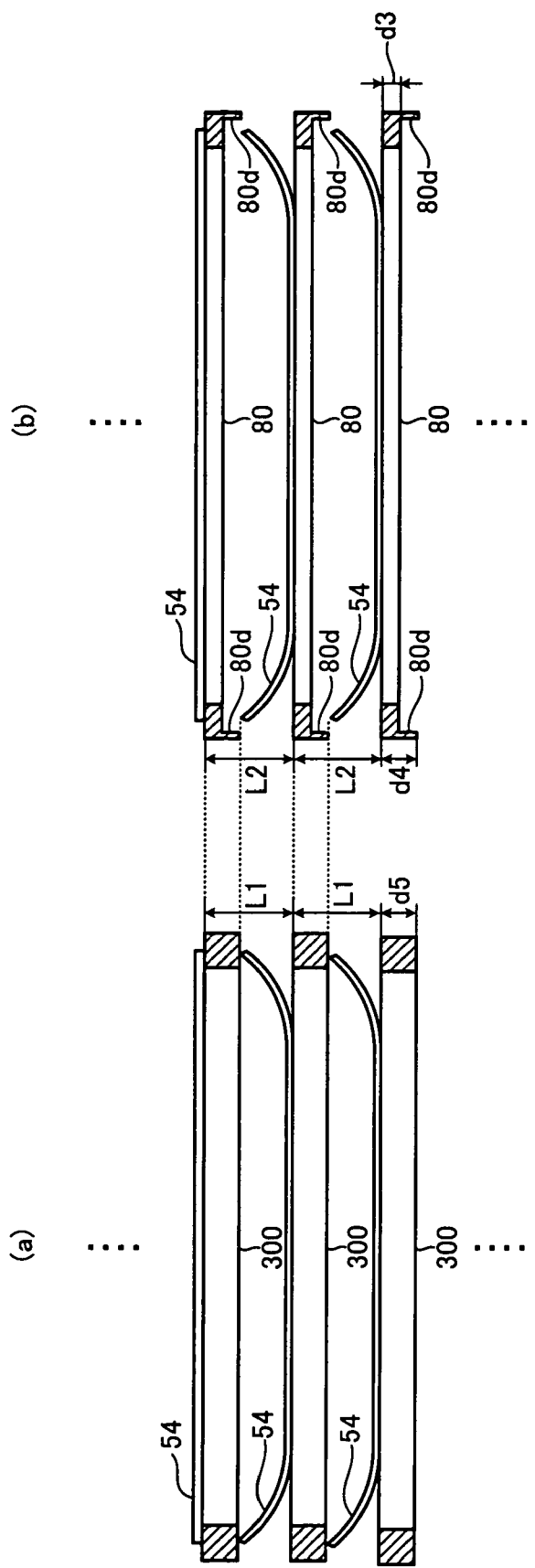
FIG. 8 is a view showing comparatively a ring member of a second embodiment of the invention and a ring member of a third comparative example, wherein (a) shows a sectional view of the ring member of the third comparative example while (b) a vertical sectional view of the ring member of the second embodiment.

FIG. 8 shows ring member 80 according to the present embodiment and ring member 300 according to the third comparative example, contrastively. FIG. 8(*a*) shows ring member 300 of the third comparative example while FIG. 8(*b*) shows ring member 80 of the present embodiment. As shown in FIG. 8(*a*), ring member 300 of the third comparative example is formed thicker (d5 in FIG. 8(*a*)) wholly in the entirety of ring member 300 than the thickness (d3 in FIG. 8(*b*)) of the portion other than thick-walled portion 80*d* of the ring member 80 of present embodiment. Here, it is assumed that the thickness (d5 in FIG. 8(*a*)) in the entire of ring member 300 of the third comparative example is equal to the thickness (d4 in FIG. 8(*b*)) of thick-walled portion 80*d* in ring member 80 of the present embodiment, i.e. d5=d4.

Meanwhile, as shown in FIG. 8(*a*), ring member 300 of the third comparative example is placed on holder body 34 (not shown) such that distance (board pitch) is given, for example, L1 between the adjacent ones of ring members 300 of the third comparative example. Likewise, ring member 80 of the present embodiment is placed on holder body 34 (not shown) such that distance (board pitch) is given, for example, L2 between the adjacent ones of ring members 80, as shown in FIG. 8(*b*). Here, it is assumed that the board pitch in holder 30 placed with ring members 300 of the third comparative example is equal to the board pitch in holder 30 placed with ring members 80 of the present embodiment, i.e. L1=L2.

In the case that substrate 54 warps in a certain degree as shown in FIGS. 8(*a*) and 8(*b*) upon being placed in or out of the reactor or so at high temperature for example, substrate 54 put on ring member 300 of the third comparative example goes into contact with ring member 300. Namely, substrate 54 hits at its main surface against the backside (lower surface) of ring member 300 located above thereof (FIG. 7(*a*)). This possibly damages the main surface of substrate 54 and further produces particles.

Meanwhile, ring member 300 of the third comparative example can be prevented from being deformed by the heat because ring member 300 is formed thick in the entire thereof. However, the load on holder body 34 increases because of the increased weight of ring member 300 itself.

Meanwhile, as for substrate 54 put on ring member 80 of the present embodiment, substrate 54 does not contact with ring member 80 even in the case the substrate put on ring member 300 of the comparative example warps in amount equal to the case contacting with ring member 300 located above thereof. Namely, substrate 54 does not hit on the backside (lower surface) of ring member 80 located above thereof (FIG. 8(*b*)).

In this manner, in ring member 80 of the present embodiment, the portion of ring member 80 lying outer than substrate 54 upon putting substrate 54 on ring member 80 is made thicker than the other portion (formed with thick-walled portion 80*d*) throughout the entire thereof. This makes it possible to reduce the thickness in the other portion than the thick-walled portion 80*d* of ring member 80 and to secure a space greater over substrate 54 as compared to ring member 300 of the third comparative example. Accordingly, there is eliminated a contact (collision) of substrate 54 with the backside of ring member 80 due to a warp (deformation) of substrate 54 even if loading to or unloading from the reactor is done at high temperature, which reduces the surface damage to substrate 54, prevents the occurrence of particles and reduces the contamination on substrate 54. This also improves throughput because of the capability of loading to or unloading from the reactor at high temperature. Furthermore, the number of substrates to process can be increased because of the capability of reducing the on-boat pitch (wafer pitch).

Furthermore, in ring member 80 of the present embodiment, the load on holder body 34 can be reduced because of the capability of reducing the weight of ring member 80 as compared to ring member 300 of the third comparative example.

Now explanation is made on ring member 80 according to a third embodiment.

Figure 9:
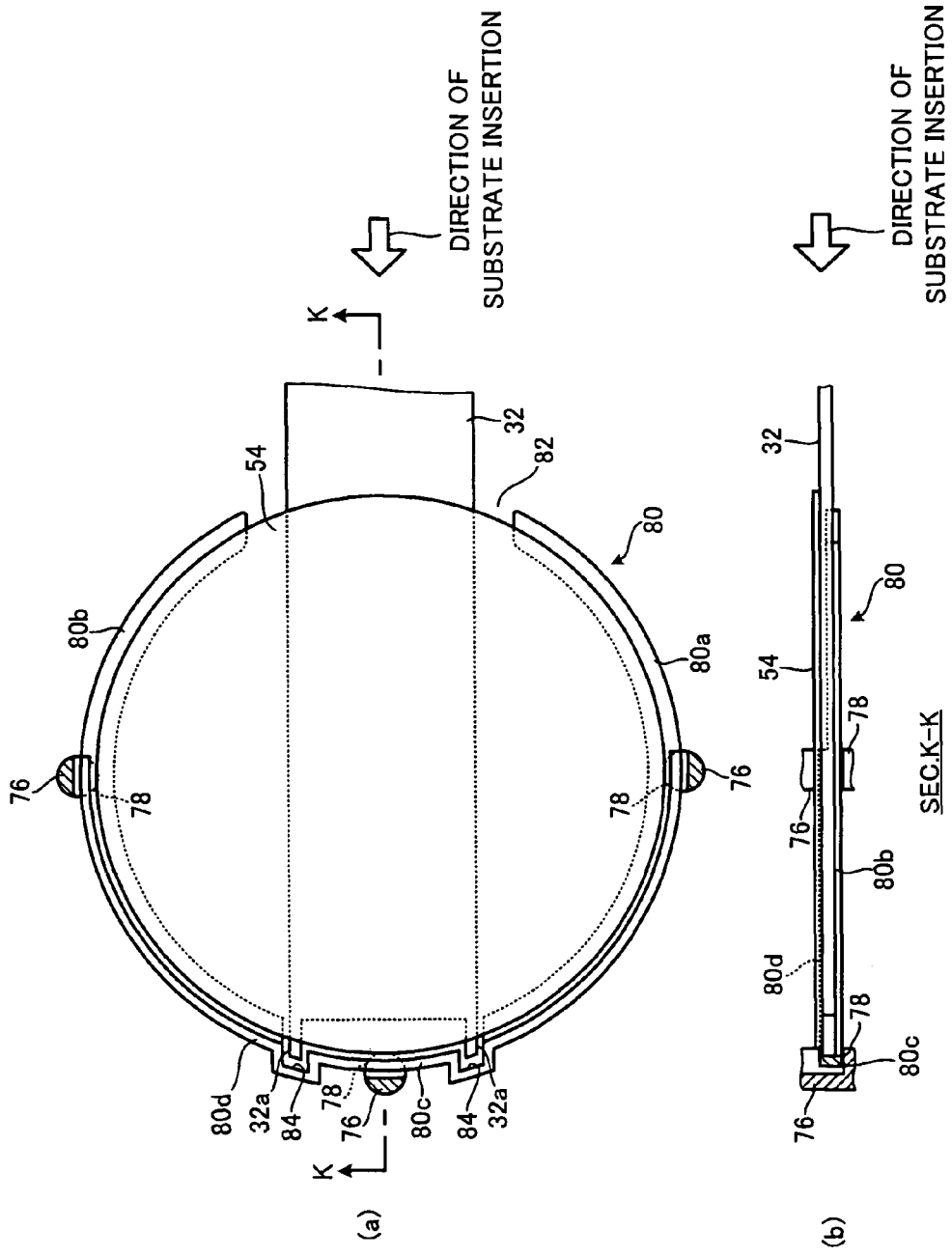
FIG. 9 is a view showing a state that a substrate transfer plate is inserted into a ring member of a third embodiment of the invention, wherein (a) shows a top view while (b) a sectional view taken on line K-K in (a).

FIG. 9 shows ring member 80 according to the third embodiment.

Ring member 80 of the third embodiment is different in the region where thick-walled portion 80*d* is provided and in the form of connecting portion 80*c*, from ring member 80 of the first embodiment. The other structure than that is similar to ring member 80 of the first embodiment. Note that holder body 34 in the third embodiment is different in the number of pillars 76, i.e. support points of ring member 80 by support pieces 78, from holder body 34 of the first embodiment. Holder body 34 of the first embodiment has four pillars 76, i.e. four support points of ring member 80 by support pieces 78 whereas holder body 34 of the third embodiment has three pillars 76, i.e. three support points of ring member 80 by support pieces 78. Incidentally, in holder body 34 of the third embodiment, pillars 76, 76, 76 are provided two on the side of substrate insertion and one on the side opposite thereto as viewing holder body 34 from above.

As shown in FIG. 9, in ring member 80 of the third embodiment, thick-walled portion 80*d* is provided in a portion extending from the protrusion directed toward back with respect to the direction of substrate insertion to a region adjacent thereto and to be supported by support pieces 78, 78, 78. Namely, thick-walled portion 80*d* is formed covering over the entire of support pieces 78, 78, 78.

Connecting portion 80*c* is formed in a region in the back of ring member 80 with respect to the direction of substrate insertion. It is arranged to lie outer than the substrate 54 upon putting substrate 54 on ring member 80 by substrate transfer plate 32, thus having a plurality of (two in the present embodiment) concaves 84.

Incidentally, substrate transfer plate 32 has, at its tip, a plurality of (two in the present embodiment) convexes 32a in a manner to project outer than substrate 54. Accordingly, concaves 84 of connecting portion 80c project (protrude) outer than the other region of ring member 80 (than substrate support portions 80a, 80b) so that it is made in a form to release the convexes 32a of substrate transfer plate 32 when substrate 54 is put on ring member 80 by substrate transfer plate 32.

Now explanation is made on ring member 80 according to a fourth embodiment.

Figure 10:
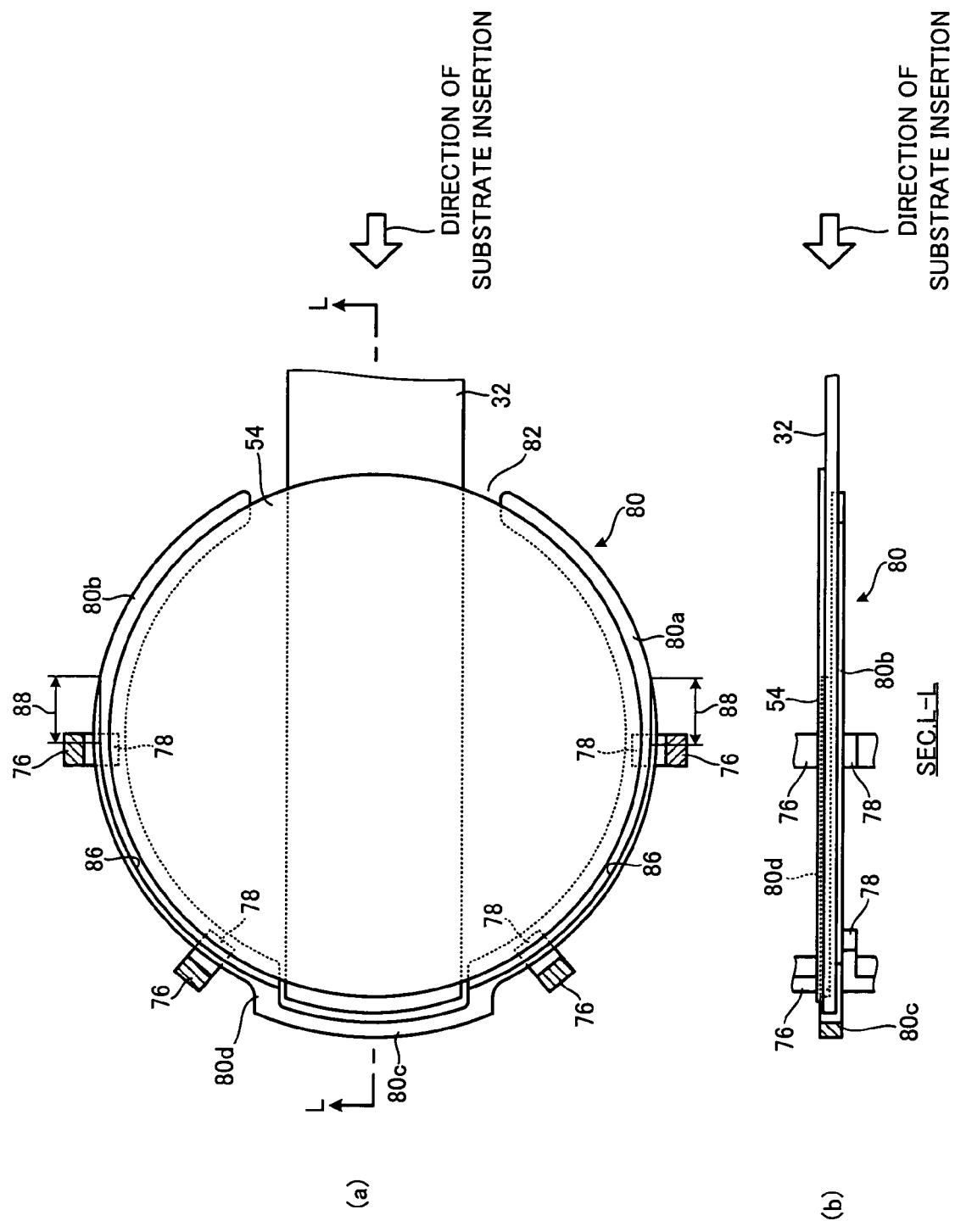
FIG. 10 is a view showing a state that a substrate transfer plate is inserted into a ring member of a fourth embodiment of the invention, wherein (a) shows a top view while (b) a sectional view taken on line L-L in (a).

FIG. 10 shows ring member 80 according to the fourth embodiment.

Ring member 80 of the fourth embodiment is different in the form of the region where thick-walled portion 80d is provided from ring member 80 of the first embodiment. The other structure than that is similar to ring member 80 of the first embodiment.

As shown in FIG. 10, in ring member 80 of the fourth embodiment, thick-walled portion 80d is provided in a portion extending from the protrusion directed toward back with respect to the direction of substrate insertion to a region adjacent thereto and to be sustained by support pieces 78, 78, 78, 78. Namely, thick-walled portion 80d is formed covering over the entire of support pieces 78, 78, 78, 78.

Meanwhile, thick-walled portion 80d has curve portions 86, 86 formed extending from connecting portion 80c to two pillars 76, 76 provided spaced nearly 180 degrees on the side of substrate insertion and straight-line portions 88, 88 connected to the curve portions 86, 86 and formed parallel with the direction of substrate insertion.

By thus providing the straight-line portions 88, 88 in thick-walled portion 80d without providing thick-walled portion 80d in regions inward of straight-line portions 88 and closer to substrate insertion than those, no effects can be given upon transfer pitch. In other words, if thick-walled portion 80d is provided in regions inward of straight-line portions 88 and closer to substrate insertion than straight-line portions 88, transfer pitch is influenced. Namely, in order to avoid the interference between substrate 54 and thick-walled portion 80d upon inserting substrate 54 to between ring members 80 and putting it on ring member 80 by substrate transfer plate 32 or upon taking substrate 54 out of ring member 80, transfer pitch is required provided greater than the case not providing thick-walled portion 80d in regions inward of straight-line portions 88 and closer to substrate insertion than those.

Incidentally, although the explanation on the embodiments used the batch-type substrate processing apparatus for thermally processing a plurality of substrates at one time, the invention is not limited to the same but may be a single-wafer type.

The substrate processing apparatus of the invention is also applicable to substrate fabrication process.

Explanation is made on an example that the substrate processing apparatus of the invention is applied to one of fabrication process steps for a SIMOX (separation by implanted oxygen) wafer, one type of SOI (silicon on insulator) wafers.

At first, oxygen ions are implanted to single-crystal silicon wafer by means of an ion-implanter or the like. Then, anneal is conducted on the oxygen-ion-implanted wafer in an atmosphere, for example, of Ar or $O_2$ at a high temperature of 1300-1400° C., e.g. 1350° C. or higher, by use of the substrate processing apparatus according to the foregoing embodiment. By the process steps, a SIMOX wafer is fabricated which is formed with an $SiO_2$ layer inside the wafer (buried with an $SiO_2$ layer).

Besides the SIMOX wafer, the substrate processing apparatus of the invention is to be applied to one of fabrication process steps for a hydrogen-annealed wafer or an argon-annealed wafer. In this case, a wafer is annealed at high temperature of approximately 1200° C. or higher in a hydrogen or Ar atmosphere by use of the substrate processing apparatus of the invention. This can reduce the crystal defect in the wafer surface layer where ICs (integrated circuits) are to be fabricated, thus improving crystal perfectness. Besides, the substrate processing apparatus of the invention is to be applied to one of epitaxial-wafer production process steps.

The substrate processing apparatus of the invention is applicable even where high-temperature anneal is conducted as one of fabrication process steps for a substrate as in the foregoing.

The substrate processing apparatus of the invention is also applicable for a semiconductor device manufacturing process.

Particularly, application is preferably for a thermal process to be conducted at a comparatively high temperature, e.g. thermal oxidation process such as wet oxidation, dry oxidation, hydrogen-combusted oxidation (pyrogenic oxidation) or HCl-based oxidation, or a thermal diffusion process of diffusing into a semiconductor thin film an impurity (dopant) such as boron (B), phosphorus (P), arsenic (As) or antimony (Sb).

The substrate processing apparatus of the invention is also applicable where thermal process is conducted as one of semiconductor device manufacturing process steps.

INDUSTRIAL APPLICABILITY

The present invention is to be utilized where there is a necessity to suppress the occurrence of substrate slippage, on a substrate processing apparatus for processing a semiconductor wafer, a glass substrate or the like.

The invention claimed is:

1. A substrate processing apparatus comprising:
a process chamber for processing a substrate;
a heater for heating an interior of the process chamber;
a holder for supporting the substrate in the process chamber; and
a substrate transfer plate for transferring the substrate to the holder;
wherein the holder has a retainer for supporting the substrate at its outer periphery and a main body for supporting the retainer, a portion of the retainer extending at least from a back region of the retainer with respect to an inserting direction of the substrate transfer plate to a region adjacent the back region and being in contact with the main body and lying outside the outer periphery of the substrate upon putting the substrate on the retainer being made thicker than other portions of the retainer.

2. The substrate processing apparatus of claim 1, wherein the portion of the retainer lying outside the outer periphery of the substrate upon putting the substrate on the retainer is thicker than the other portions throughout the retainer in its entirety.

3. The substrate processing apparatus of claim 1, wherein the back region of the retainer with respect to the inserting direction of the substrate transfer plate protrudes outside the other portions of the retainer.

4. The substrate processing apparatus of claim 1, wherein the back region of the retainer with respect to the inserting direction of the substrate transfer plate is in a form to release a tip of the substrate transfer plate when the substrate is put on the retainer by the substrate transfer plate.

5. The substrate processing apparatus of claim 1, wherein the back region of the retainer with respect to the inserting direction of the substrate transfer plate is arranged in a portion lying outside the outer periphery of the substrate upon putting the substrate on the retainer.

6. The substrate processing apparatus of claim 1, wherein the back region of the retainer with respect to the inserting direction of the substrate transfer plate is a connecting portion through which different portions of the retainer are connected together, the connecting portion being arranged in a portion lying outside the outer periphery of the substrate upon putting the substrate on the retainer.

7. The substrate processing apparatus of claim 1, wherein the retainer is provided with a cutout in a part thereof on an inserting side of the substrate.

8. The substrate processing apparatus of claim 1, wherein the retainer is in a C-form.

9. The substrate processing apparatus of claim 1, wherein the holder is structured to support a plurality of substrates horizontally with spacing in a stack form.

10. The substrate processing apparatus of claim 1, wherein a thick walled portion of the retainer protrudes toward a surface thereof rather than the other portions of the retainer.

11. A substrate processing apparatus comprising:
a process chamber for processing a substrate;
a heater for heating an interior of the process chamber; and
a holder for supporting the substrate in the process chamber;
wherein the holder has a retainer for supporting the substrate at its outer periphery and a main body for supporting the retainer, the retainer having a protrusion at least in a part of the retainer that protrudes outside other parts of the retainer, a portion of the retainer extending at least from the protrusion to a region adjacent the protrusion and beyond connections between the protrusion and the other parts of the retainer and lying outside the outer periphery of the substrate upon putting the substrate on the retainer being thicker than other portions of the retainer.

12. A holder comprising:
a retainer for supporting a substrate at an outer periphery thereof; and
a main body for supporting the retainer;
wherein the retainer has a protrusion at least in a part of the retainer that protrudes outside other parts of the retainer, a portion of the retainer extending at least from the protrusion to a region adjacent the protrusion and being in contact with the main body and lying outside the outer periphery of the substrate upon putting the substrate on the retainer being thicker than other portions of the retainer.

13. A holder comprising:
a retainer for supporting a substrate at an outer periphery thereof; and
a main body for supporting the retainer;
wherein the retainer has a protrusion at least in a part of the retainer that protrudes outside other parts of the retainer, a portion of the retainer extending at least from the protrusion to a region adjacent the protrusion and beyond connections between the protrusion and the other parts of the retainer and lying outside the outer periphery of the substrate upon putting the substrate on the retainer being thicker than other portions of the retainer.

14. A retainer for supporting a substrate at an outer periphery thereof, the retainer supported by a main body, the retainer comprising:
a protrusion provided at least in a part of the retainer that protrudes outside other parts of the retainer, a portion of the retainer extending at least from the protrusion to a region adjacent the protrusion and being in contact with the main body and lying outside the outer periphery of the substrate upon putting the substrate on the retainer being thicker than other portions of the retainer.

15. A retainer for supporting a substrate at an outer periphery thereof, the retainer comprising:
a protrusion provided at least in a part of the retainer that protrudes outside other parts of the retainer, a portion of the retainer extending at least from the protrusion to a region adjacent the protrusion and beyond connections between the protrusion and the other parts of the retainer and lying outside the outer periphery of the substrate upon putting the substrate on the retainer being thicker than other portions of the retainer.

16. A semiconductor device manufacturing method comprising:
supporting a substrate using a holder having a retainer for supporting the substrate at its outer periphery, and a main body for supporting the retainer, the retainer having a portion extending at least from a back region of the retainer with respect to an inserting direction of a substrate transfer plate to a region adjacent the back region and being in contact with the main body and lying outside the outer periphery of the substrate upon putting the substrate on the retainer, the portion being made thicker than other portions of the retainer;
loading the substrate supported by the holder into a process chamber;
thermally processing the substrate supported by the holder in the process chamber; and
unloading the processed substrate from the process chamber.

17. A semiconductor device manufacturing method comprising:
supporting a substrate using a holder having a retainer for supporting the substrate at its outer periphery and a main body for supporting the retainer, the retainer having a protrusion at least in a part of the retainer that protrudes outside other parts of the retainer, a portion of the retainer extending at least from the protrusion to a region adjacent the protrusion and beyond connections between the protrusion and the other parts of the retainer and lying outside the outer periphery of the substrate upon putting the substrate on the retainer being thicker than other portions of the retainer;
loading the substrate supported by the holder into a process chamber;
thermally processing the substrate supported by the holder in the process chamber; and
unloading the processed substrate from the process chamber.

* * * * *